US006636164B1

(12) United States Patent
Salminen

(10) Patent No.: US 6,636,164 B1
(45) Date of Patent: Oct. 21, 2003

(54) KEY STRUCTURE FOR THE USER INTERFACE OF AN ELECTRICAL DEVICE

(75) Inventor: Seppo Salminen, Turku (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/471,919

(22) Filed: Dec. 23, 1999

(65) Prior Publication Data

(65)

(30) Foreign Application Priority Data

Dec. 28, 1998 (FI) ........................................ 982802

(51) Int. Cl.[7] ........................................ H03M 11/00
(52) U.S. Cl. ........................ 341/34; 200/345; 400/490
(58) Field of Search ........................ 341/34; 400/490, 400/491, 491.2; 200/345, 406, 513, 516, 19.12, 43.01, 43.13, 61.49

(56) References Cited

U.S. PATENT DOCUMENTS 4,642,627 A * 2/1987 Hodsdon .................... 341/13
4,766,271 A * 8/1988 Mitsuhashi et al. ......... 200/512
4,839,474 A * 6/1989 Hayes-Pankhurst et al. 200/5 A
4,952,761 A * 8/1990 Viebrantz .................. 200/513
5,247,143 A * 9/1993 Suwa ....................... 200/344
5,735,619 A * 4/1998 Myint ....................... 400/488
5,881,866 A * 3/1999 Miyajima et al. ........... 200/314
5,909,804 A * 6/1999 Kuratani .................... 200/406
5,924,555 A * 7/1999 Sadamori et al. ........... 200/238
5,986,228 A * 11/1999 Okamoto et al. ........... 200/516
5,999,084 A * 12/1999 Armstrong .................. 200/516
6,040,823 A * 3/2000 Seffernick et al. ............ 341/34

FOREIGN PATENT DOCUMENTS

DE 4128778 3/1993
DE 9310721.8 12/1993
DE 9414953.4 1/1995
EP 0657908 6/1995
WO WO 94/04974 3/1994

OTHER PUBLICATIONS

"Dual Watertight Method for Sealing a Hinged Door", IBM Technical Disclosure Bulletin, vol. 38, No. 12, 1995, p. 505.

* cited by examiner

*Primary Examiner*—Michael Horabik
*Assistant Examiner*—Hung Q Dang
(74) *Attorney, Agent, or Firm*—Perman & Green, LLP

(57) ABSTRACT

A key structure used in the user interface of an electrical device comprises a plate-like member (301) which comprises electrical couplings for transforming keystrokes into electrical signals, and an electrically conducting dome-like member (303) on the plate-like member. This dome-like member is arranged to have such suitable elastic characteristics that it is at least partly pressed against the plate-like member when a pressing force substantially perpendicular towards the plate-like member acts on the dome-like member, and to return to the dome-like position when the pressing force is removed. The key structure further comprises a button member (304) made of an electrically isolating material and being located on the dome-like member. The key structure is characterised in that the elastic deformation of the button member due to the pressing force is substantially similar to that of the dome-like member.

20 Claims, 4 Drawing Sheets

KEY STRUCTURE FOR THE USER INTERFACE OF AN ELECTRICAL DEVICE

The invention relates generally to the keys and keypads of operating interfaces of electrical devices. Particularly the invention relates to a thin and simple mechanical key and keypad structure.

A key or a keypad comprises a mechanical structure and an electrical coupling, and this combination transforms the keystrokes made by a user into electrical input signals to the device being used. In many devices the mechanical structure of the keypad currently occupies substantially more space and is much heavier than the electrical coupling with which the keystrokes are detected.

Particularly in the design of many portable terminals the object is to minimise the mass and volume of the device, so that the objects are mechanical structures which are lighter and smaller than previously. However, the design of the structures must observe the fact that particularly the characteristics of the keypad are important regarding the operating convenience, and that for instance too small keys located too close to each other are inconvenient to use. The operating convenience is not directly affected when the keypad structure is made thinner, if this does not essentially impair the tactile feel.

In prior art keypads the electrical coupling which transforms the user's keystrokes into electrical input signals is generally based on the following idea. Below the keypad having keys in N rows and M columns there are N conductors in the row direction and M conductors in the column direction, so that under each key two conductors cross each other at right angles. When a key is up in the idle position there is no electrical contact between the conductors, but when the user depresses the key an electrical contact is formed between the conductors. The depressed key can be unanimously determined based on the position where said contact is located.

In the electrical couplings of the keypad structures in general use a keystroke should thus cause an electrical contact between adjacent conductors. In prior art mechanical structures this is arranged so that there is an electrically conducting raised dome below the key button. When the key is in the idle state the dome is up, and when the key is depressed it presses the dome down. The dome is pressed against the crossing conductors below it, and an electrical contact is formed between them. The dome acts also as a spring which returns the key into the initial position when the force acting from above on the key is removed. Thus a separate spring below the key button is not required. For the sake of clarity is should be mentioned that below the term "key" refers to that key button which the user is striking. The terms mechanical or electrical structure of a key or keypad refer also to other parts of the key than to only to the key button.

The mechanical structure of a prior art key is shown in FIG. 1. On the printed circuit board 101, which comprises a circuit arrangement for reading the keystrokes, there is an electrically conducting dome 102 in the intersection of the conductors. If the whole dome is made of an electrically conducting material, typically of metal, then the edges of the dome can be isolated from the conductors, for instance by a separate isolating layer 103 having at the conductor intersections holes with a diameter smaller than that of the domes, or by using a multi-layer printed circuit board whereby the conductors are on the surface of the board only at their intersections. If only that part of the dome 102 which in a keystroke is pressed against the printed circuit board is of an electrically conducting material, then a separate isolating layer 103 is not required, as the dome can rest against the printed circuit board supported directly by its electrically isolating periphery. Such a dome with a lower surface conducting in only some places can be made for instance by metalling a suitable part of the concave lower surface of a dome made of plastics. Over each dome there is a key 104 having a cylindrical upper part. The lower part of the key expands into a cylindrical base containing a hollow which enables the normal upper position of the dome when the key is not depressed. Thus the key rests against the printed circuit board 101 on a peripheral support surface.

In the bottom of the key's upper part, against the dome, there is a projection 105 having a smaller area than the upper part and actually depressing the electrically conducting centre of the dome against the printed circuit board when the key is depressed. The structure formed by the cylindrical upper part of the key and the projection at the bottom of the key is substantially rigid, and when the key is depressed the elasticity enabling the vertical movement of the key occurs at the thin joint between the upper part and the base. The material of the key must be sufficiently flexible so that the joint between the base and the upper part will yield in a desired manner. The keys can be made of rubber, for instance.

The projection in the bottom of the cylindrical upper part of the key is necessary, because otherwise the whole bottom surface of the key's upper part would be pressed against the electrically conducting dome. Then the spring-like action of the dome when it is depressed by the narrower point could be lost, and the force required to press the button so that the whole surface of the dome could be pressed against the conductors on the surface of the printed circuit board would be greater than in the structure shown in FIG. 1.

A prior art way to fasten a key or a keypad to the electrical device in question is shown in FIG. 2. The keys, which are either separate or form a continuous keymat by being fastened to each other at their bases, move vertically in the guiding gaps of the cover 201. The cover is fastened at its edges to the frame of the device, whereby it presses the keys/keypad against the electrically connecting domes and the printed circuit board. A generally used cover profile is seen in FIG. 2: in order to minimise the material used for the cover and the mass of the cover it is not a continuous perforated plate with an even thickness.

A prior art keypad is assembled of many separate components, so the assembly requires several work steps. The thickness of the keypad is several millimetres, typically 5 to 8 mm. Particularly in small portable terminals this thickness is considerable compared to the total thickness of the device. If the keypad is designed to have a convex form, for instance, then the cylindrical parts of the keys and the cover at the centre of the keypad are higher than at the edges, as the printed circuit board at the bottom of the keypad is generally a planar board.

The operating convenience of the devices increases substantially if they are water-tight, but because in prior art solutions the bottom surface of the keypad cover is uneven, and because the key structure is flexible exactly at that point where the cover rests against the keys/keymat it is difficult to obtain a water-tight structure.

An object of the invention is to present a mechanical key structure which is thin and which enables the construction of thin keypads. Advantageously the new mechanical structure does not require any changes in the electrical couplings of prior art keypads. A further object of the invention is to simplify the structure and production of the keypads.

The object of the invention is attained by coating the electrically conducting domes being an essential part of the keypad structure with a thin dielectric layer.

A key structure according to the invention is a key structure used in the user interface of an electrical device and it comprises

- a plate-like member comprising electrical couplings for transforming keystrokes into electrical signals,
- an electrically conducting dome-like member on said plate-like member, whereby the dome-like member is arranged to have such suitable elastic characteristics that it is at least partly pressed against the plate-like member when a pressing force substantially perpendicular towards the plate-like member acts on the dome-like member, and to return to the dome-like position when the pressing force is removed, and
- a button member made of an electrically isolating material and being located on said dome-like member, wherein said button member is arranged to undergo an elastic deformation due to said pressing force, substantially in the same way as said dome-like member.

The invention relates also to a keypad of the user interface of an electrical device, the keypad comprising

- a plate-like member which comprises electrical couplings for transforming keystrokes into electrical signals,
- electrically conducting dome-like members on said plate-like member, whereby each of the dome-like members is arranged to have such suitable elastic characteristics that it is at least partly pressed against the plate-like member when a pressing force substantially perpendicular towards the plate-like member acts on the dome-like member, and to return to the dome-like position when the pressing force is removed,
- button members made of an electrically isolating material and being located on said dome-like members, and
- a cover member covering said plate-like member and the surface of said cover member defines a hole at least at the location of each button member, wherein
- said button members are arranged to undergo an elastic deformation due to the effect of said pressing force, substantially in the same way as said dome-like members, and
- said cover member is a substantially plate-like body with a uniform thickness, with the exception of the holes.

In the key structure according to the invention there is a key button over the electrically conducting dome on a plate-like member, for example, a printed circuit board, and the elastic deformation of the button against the plate-like member due to the action of a pressing force substantially in the vertical direction and its removal is substantially like that of the electrically conducting dome.

The pressing force presses the electrically conducting dome against conductors, which are close to each other under a certain part, in order to form an electrically conducting contact. This deformation is elastic, and the dome returns into its initial, dome-like position when the force is removed. In its normal position the thin key button according to the invention has substantially the form of the dome, and due to a pressing force it experiences a similar elastic deformation as the dome below it: that part of the key button, which is over that dome part being pressed against the printed circuit board, is pressed downwards so that it imitates the movement of the dome. Both the dome and the key return to the upper position when the pressing force is removed. The characteristics felt by the user's fingers are good, and compared to the higher key buttons the thin keys save space and manufacturing material.

The use of the thin keys according to the invention makes it possible to use thin, plate-like cover structures for the keypads. The thin keys do not require any guide shafts to prevent lateral swaying, and thus the cover can be as thin as the keys. This saves both space and material. Further the manufacture of a plate-like cover is simpler than the manufacture of a profile structure, for instance. A mechanical keypad structure according to the invention does not require any changes in the electrical couplings and related structures of the keypad.

The keys according to the invention can be fastened at their lower edges directly to the surface of the dome and the plate under the dome, as a thin key imitates the movements of the electrically conducting dome. The cover can also be fastened to the same board, and thus a solid structure is obtained. Another possibility is to fasten the thin, flexible keys according to the invention to a plate-like cover, for instance at the edges of the keys to the edges of the holes in the cover. This provides a continuous cover structure which is water-tight, for instance. Further the manufacture of the device is simple, as no separate keys or keypads must be placed into their places during the assembly phase.

The invention is described below in more detail with reference to embodiments presented as examples and to the enclosed figures, in which FIG. 1 shows a key structure according to the prior art;

Figure 1:
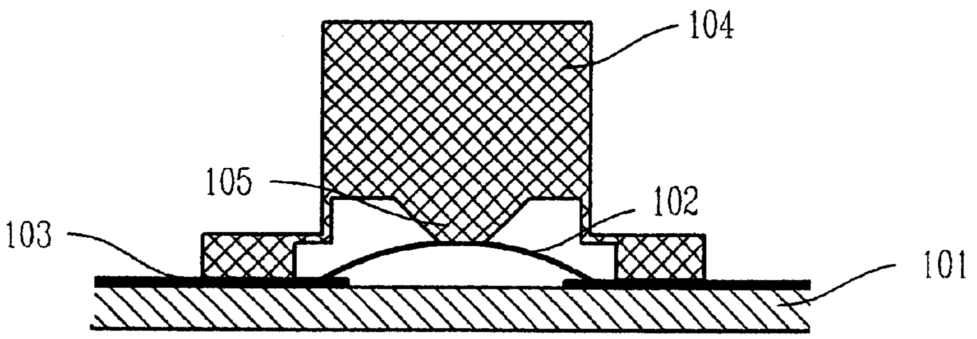
Fig. 1 Prior art
Figure 2:
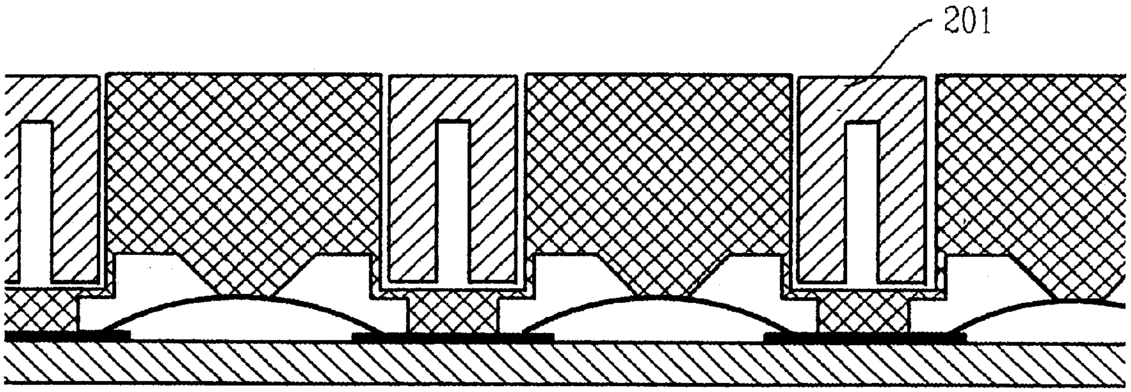
Fig. 2 Prior art
FIG. 2 shows a keypad structure according to the prior art.

Above reference was already made to the FIGS. 1 and 2 in connection with the description of prior art.

Figure 3:
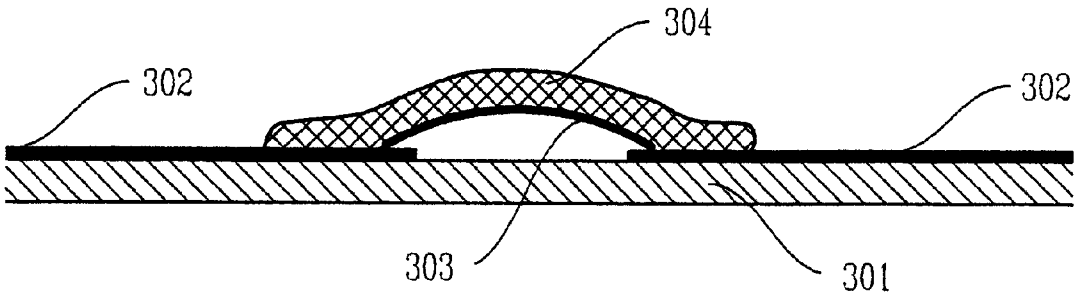
FIG. 3 shows the thin key structure according to a preferred embodiment of the invention.

FIG. 3 shows a key structure according to the invention. On the printed circuit board 301 the electrically conducting dome 303 being supported by the dielectric layer 302 is coated with an evenly thick layer of electrically isolating flexible material, for instance of rubber or a similar material. This dielectric layer is thin, with a thickness typically less than a millimetre, and typically it will not be compressed by forces of those magnitudes usually being used to depress a key. When the key is depressed the flexible key button 304 thus remains evenly thick, and the pressing force is transmitted to the surface of the dome. The centre of the dome is pressed against the printed circuit board surface below it, and the centre of the key button is depressed like a dimple, imitating the movement of the dome. When the user terminates the pressing, then both the key button and the dome return to the initial raised position shown in FIG. 3.

In the structure shown in FIG. 3 the dome 303 can be wholly made of an electrically conducting material, for instance of metal. It can also be made for instance of plastics or a similar material, and the concave lower surface of the dome can be plated with an electrically conducting material, for instance metalled. If the edges of the lower surface of the dome are not plated, then a separate dielectric layer 302 is not required.

Figure 4:
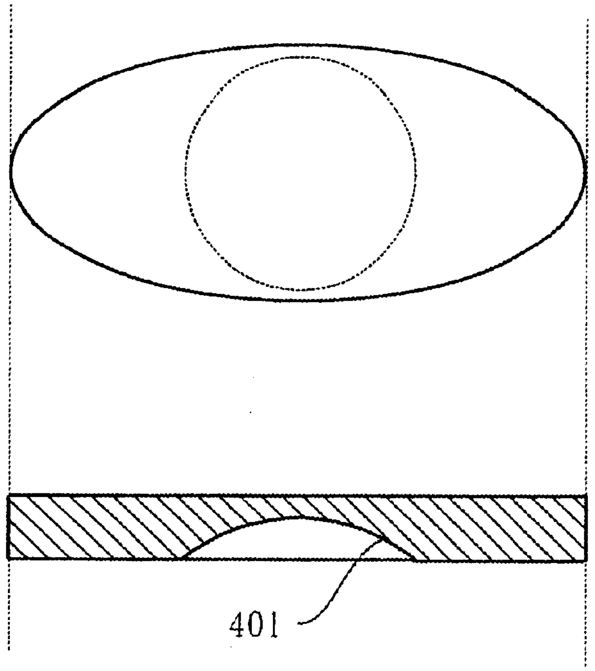
FIG. 4 shows the thin key button according to a preferred embodiment of the invention.

FIG. 4 shows an advantageous way to make a thin key button according to the invention: a disc, having a thickness of about 1 mm and made of a flexible and dielecric material, again for instance rubber or a similar material, is shaped on the lower side into the form of an electrically conducting dome. This recess 401 in the lower surface of the key enables the normal dome position when the key is not depressed.

The form of the key shown in FIG. 4 makes it possible to use a material which is stiffer than if the electrically conducting dome would be coated with an evenly thick electrically isolating layer, as shown in FIG. 3. The top surface of the key shown in FIG. 4 can be planar, where it is easy to print text, for instance.

Figure 5:
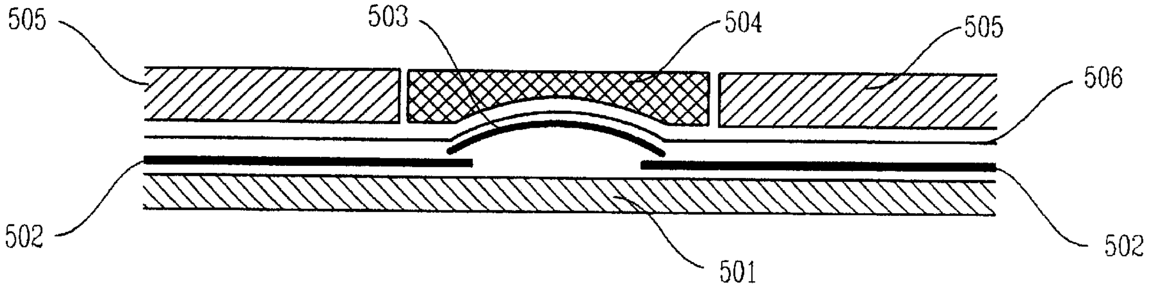
FIG. 5 shows a thin keypad structure according to a preferred embodiment of the invention.

The thin keys can be utilised for making single buttons, or they can be assembled into a thin keypad. FIG. 5 shows the cross-section of a thin key structure according to a preferred embodiment of the invention; for the sake of clarity the different parts of the structure are drawn at a short distance from each other. The frame of the structure is a printed circuit board 501 which contains the required electrical couplings. Over the printed circuit board there is a dielectric layer 502 having a hole at the location of a key. An uncoated conductor pair related to the key is located at the hole in the dielectric layer. An electrically conducting dome 503 is located over the conductors, so that its edges are above the dielectric layer. A thin key 504, for instance according to the FIG. 4, is placed over the dome, and the rest of the dielectric layer is covered by a cover structure 505, manufactured for instance of plastics or a similar material. The cover is a plate with a uniform thickness and with a hole at the location of each key. The key and the cover can be fastened to the surface of the dielectric layer over the electrically conducting dome and the printed circuit board, for instance with the aid of an adhesive film 506. This results in a plate-like solid structure with a thickness of about 1.5 mm. In quite the same way it is possible to manufacture a thin keypad.

In the same way as in the structure shown in FIG. 3 the dome 503 can be made completely of an electrically conducting material, such as a metal, or it can be made for instance of plastics or a similar material and the lower surface of the dome can be coated over a suitable part with an electrically conducting material. Thus a separate dielectric layer 502 is not necessarily required. The same applies also to the structures shown in FIGS. 6 and 7.

Figure 6:
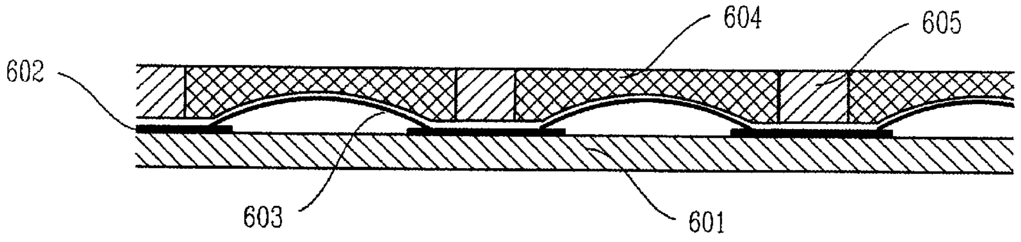
FIG. 6 shows a thin keypad structure according to second preferred embodiment of the invention.

FIG. 6 shows the cross-section of a water-tight keypad structure according to an advantageous embodiment of the invention. The components of the keypad are the same as in FIG. 5: a printed circuit board 601, a dielectric layer 602, an electrically conducting dome 603, a key 604 and a cover structure 605. The thin, flexible keys 604, which again are presented in an exemplary way according to the FIG. 4, are fastened to the edges of the holes in the cover structure, for instance in the moulding stage of the cover. This provides a uniform cover structure which in the assembly phase of the device is easier to handle than separate keys and cover. A further advantage of a cover structure of this kind is that it is water-tight. The cover can be fastened for instance with an adhesive film to the dielectric layer over the printed circuit board and to the electrically conducting domes (the adhesive film is not shown in FIG. 6). Another alternative is to fasten the printed circuit board 601 and the cover structure 605 to the device frame, so that they are suitably pressed against each other keeping the electrically conducting domes in their places. The thickness of this keypad is also about 1.5 mm.

Figure 7:
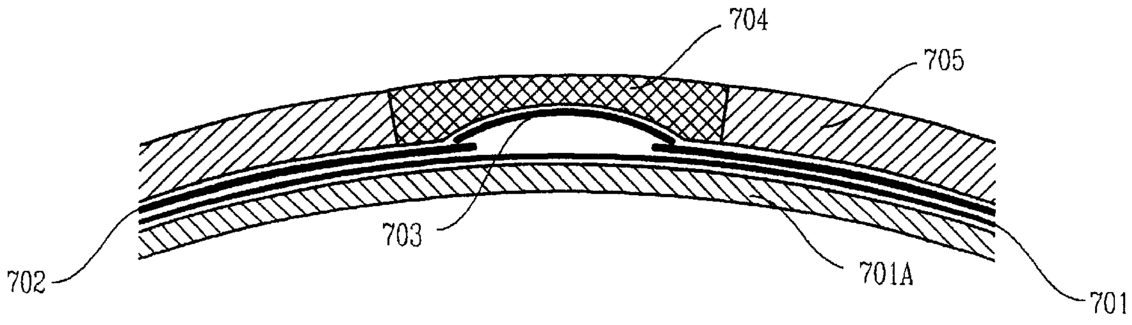
FIG. 7 shows a curved keypad structure according to a third preferred embodiment of the invention.

FIG. 7 shows the cross-section of a thin curved key structure according to a preferred embodiment of the invention. If it is not possible to manufacture a curved structure of the generally used printed circuit board material, then the printed circuit board at the bottom of the key structure can be replaced for instance by a support structure 701A made of a plastic-like material which is moulded into a curved shape, and a flexible, film-like printed circuit board 701 containing the required couplings is fastened over this support structure. The thin dielectric layer 702 and a possible film of adhesive will adapt themselves to this curved surface of the support structure, in the same way as the flexible keys 704. The key button shown in FIG. 7 is again as an example like that of FIG. 4. The cover structure 705 made for instance of plastics or a corresponding material has a curved form.

It is not quite necessary to change the form of the electrically conducting domes 703, compared to a flat keypad structure, because a large radius of curvature in the depth direction compared to the length and width of the support structure has no substantial effect on how evenly a dome rests on its edges. If the dome rests only on a part of its edge, and this has a too large effect on the flexibility characteristics of the dome, or if it is desired to design a keypad with a stronger curvature (or to use a smaller radius of curvature in the depth direction), then it is possible either to change the shape of the dome so that its form will not anymore resemble a calotte cut out with a plane from a sphere, or to design a curved support structure so that it is locally planar below the domes, at the location of the keypad rows. In this case the cover structure 705 can be shaped so that its outer surface is evenly curved, and that its inner surface against the supporting structure imitates the form of the support structure. However, the cover is still a substantially curved plate with holes and a uniform thickness.

If in the structure presented in FIG. 7 the printed circuit foil 701, the dielectric layer 702 and any adhesive layer are transparent, the keys partly transparent, and if the support structure 701A is made of a lightguide, then the keypad can be illuminated by supplying suitably directed light into the support structure. The light propagates through the support structure and the printed circuit foil to the keys and illuminates them. Correspondingly, the keys of the planar structure shown in FIG. 6 can also be illuminated if the printed circuit board 601 is replaced with a transparent printed circuit foil and a support structure made of a lightguide.

A thin solid keypad structure, for instance according to the FIGS. 5, 6 or 7, is easy to place also in a moving part of the device. For instance, a keypad comprising a large number of keys can be realised so that a part of the keys are located in the sliding cover of the device, and when the cover is slid out of the way more keys are uncovered.

Expressions relating to the directions in this description should be understood as illustrating expressions, and they mainly refer to the enclosed figures. They do not limit the invention to relate to keys or keypads located in any particular position.

What is claimed is:

1. A key structure used in the user interface of an electrical device, the key structure comprising:

A plate member which comprises electrical couplings for transforming keystrokes into electrical signals;

An electrically conducting dome member on said plate member resting against said plate member, which dome member is arranged to have such suitable elastic characteristics that it is at least partly pressed against the plate member when a pressing force substantially perpendicular towards the plate member acts on the dome member, and to return to the dome position when the pressing force is removed; and A button member made of an electrically isolating material and being on top of said dome member, wherein a lower edge of said button member is contiguously engaged with the surface of said dome member and said dome member is covered in total by said button member, and said button member is arranged to undergo an elastic deformation due to said pressing force in the same manner as said dome member.

2. A key structure according to claim 1, wherein said button member substantially has a disc shape and at the lower edge of said button member the surface of the button member defines a recess with space for engaging said dome member.

3. A key structure according to claim 1, wherein the outer circle of said dome member is arranged to be electrically isolated from said plate member.

4. A key structure according to claim 2, wherein thickness of said key structure is about 1 mm.

5. A keypad of the user interface of an electrical device, the keypad comprising:

a plate member which comprises electrical couplings for transforming keystrokes into electrical signals;

electrically conducting dome members on said plate member resting against said plate member, whereby each of the dome members is arranged to have such suitable elastic characteristics that it is at least partly pressed against the plate member when a pressing force substantially perpendicular towards the plate member acts on the dome member, and to return to the dome position when the pressing force is removed;

button members made of an electrically isolating material and being on top of said dome members, and a cover member covering said plate member and the surface of said cover member defining a hole at least at the location of each button member, wherein lower edges of said button members are contiguously engaged with the surfaces of said dome members and said dome members are covered in total by said button members, and said button members are arranged to undergo an elastic deformation due to the effect of said pressing force in the same manner as said dome members, and a combination of said button members, said cover member and said plate member is arranged to form a substantially planar body with a uniform thickness.

6. A keypad according to claim 5, wherein said plate member is rigid forming a frame, and said button members and the over member are fastened to said frame.

7. A keypad according to claim 5, wherein said plate member is rigid forming a frame, said button members are fastened to said cover member, and a combination of said button embers and said cover member is fastened to said frame.

8. A keypad according to claim 5, wherein said plate member is rigid forming a frame, said button members are fastened to said cover member, and said combination of said button members and said cover member and said frame are pressed against each other by supporting them on the frame of the whole device.

9. A keypad according to claim 5, wherein said plate member is rigid forming a frame, and said frame and cover member have a curved shape.

10. A keypad according to claim 5, wherein said plate member is rigid forming a frame, and said frame or cover member is fastened to the frame of the device, so that the keypad is movable in relation to the frame of the device.

11. A keypad according to claim 5, further comprising a frame member in parallel to the plate member, wherein the frame member does not contain any electrical couplings, and the plate member is a flexible foil member containing said electrical couplings.

12. A keypad according to claim 11, wherein said frame member is of a light conducting material and said foil member is substantially transparent.

13. A keypad according to claim 11, wherein said button members and said cover member are fastened to said frame member.

14. A keypad according to claim 11, wherein said button members are fastened to said cover member and said combination of said button members and said cover member is fastened to said frame member.

15. A keypad according to claim 11, wherein said button members are fastened to said cover member, and said combination of said button members and said cover member and said frame are pressed against each other by supporting them on the frame of the whole device.

16. A keypad according to claim 11, wherein a combination of said button members, said frame member and said cover member is arranged to form a curved shape body with a uniform thickness.

17. A keypad according to claim 16, wherein said frame member having a generally curved shape is locally arranged to be planar at the locations of the outer circles of said dome members.

18. A keypad according to claim 11, wherein said frame member or said cover member is fastened to the frame of the device, so that the keypad is movable in relation to the frame of the device.

19. A keypad according to claim 5, wherein a combination of said button members, said cover member and said plate member is arranged to form a substantially planar body with a uniform thickness of about 1.5 mm.

20. A keypad according to claim 19, wherein the outer circle of said dome member is arranged to be electrically isolated from said plate member.

* * * * *